United States Patent [19]
Miyata et al.

[11] 4,258,377
[45] Mar. 24, 1981

[54] LATERAL FIELD CONTROLLED THYRISTOR

[75] Inventors: Kenji Miyata, Katsuta; Tatsuya Kamei; Masahiro Okamura, both of Hitachi, all of Japan

[73] Assignee: Hitachi, Ltd., Japan

[21] Appl. No.: 19,567

[22] Filed: Mar. 12, 1979

[30] Foreign Application Priority Data

Mar. 14, 1978 [JP] Japan .................................. 53/28252

[51] Int. Cl.³ ............................................ H01L 29/74
[52] U.S. Cl. ........................................ 357/38; 357/20; 357/22; 357/35; 357/86; 357/89
[58] Field of Search ........................ 357/38, 39, 86, 89, 357/13, 21, 35, 92, 20, 22

[56] References Cited

U.S. PATENT DOCUMENTS

| | | | |
|---|---|---|---|
| 3,475,666 | 10/1969 | Hutson | 357/38 |
| 3,617,828 | 11/1971 | Daniluk | 357/21 |
| 3,911,463 | 10/1975 | Hull et al. | 357/21 |
| 3,958,268 | 5/1976 | Kamei et al. | 357/38 |
| 3,972,061 | 7/1976 | Nelson | 357/38 |
| 3,986,904 | 10/1976 | Beasom | 357/38 |
| 4,060,821 | 11/1977 | Houston et al. | 357/38 |
| 4,150,391 | 4/1979 | Jaecklin | 357/38 |

FOREIGN PATENT DOCUMENTS 2734997  2/1978  Fed. Rep. of Germany ............. 357/92

OTHER PUBLICATIONS

H. Berger et al., "Base Ring Transistor and Method of Production" IBM Tech. Discl. Bull., vol. 14, #1, Jun. 1971, p. 302.

J. Nishizawa et al., "Static Induction ... Density," Jap. J. of Appl. Phys., vol. 16 (1977) Supplement 16-1, pp. 151-154.

*Primary Examiner*—Joseph E. Clawson, Jr.
*Attorney, Agent, or Firm*—Craig & Antonelli

[57] ABSTRACT

An improvement in a semiconductor switching device is disclosed which comprises a semiconductor substrate of a first conductivity type, an anode region of a second conductivity type formed in the semiconductor substrate adjacent to a major surface thereof, a gate region of the second conductivity type formed a distance from the anode region, and a cathode region of the first conductivity type formed in the gate region and having a higher impurity concentration than the semiconductor substrate. A channel region is formed immediately below the cathode region thereby to directly contact the cathode region to the semiconductor substrate. A current path extending from the anode region to the cathode region through the semiconductor substrate is interrupted by a depletion layer produced in the vicinity of the channel region upon application of a reverse bias across a pn-junction formed between the gate region and the cathode region. When no reverse bias voltage is applied, the anode region, the semiconductor substrate and the gate region cooperate to function as a thyristor. The semiconductor switching device has a high dv/dt capability and is easily implemented in integrated circuits.

18 Claims, 20 Drawing Figures

FIG. 9
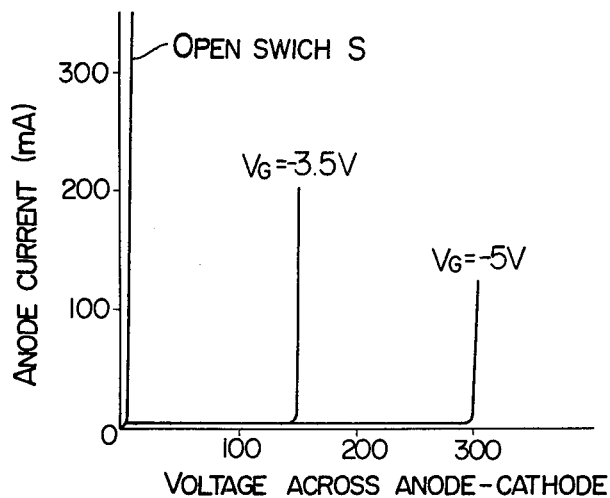
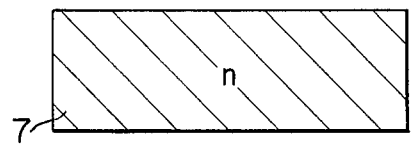
FIG. 10A
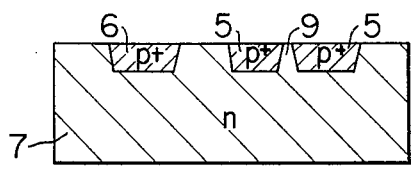
FIG. 10B
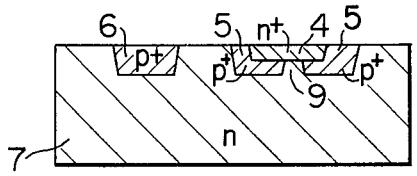
FIG. 10C

LATERAL FIELD CONTROLLED THYRISTOR

BACKGROUND OF THE INVENTION

1. Field of the Invention

The present invention relates to a semiconductor switching device. In particular, the invention relates to a semiconductor switching device having a high dv/dt capability.

2. Description of the Prior Art

Heretofore, when semiconductor switching devices are to be implemented in an integrated form, a plurality of lateral thyristors such as shown in FIG. 1, for example, are formed in respective islands isolated from one another by a pn-junction or a dielectric isolation layer with wirings to the electrodes of the lateral thyristors being made so that desired characteristics are obtained. Associated circuits are formed in the same semiconductor substrate. In FIG. 1, numerals 1, 2 and 3 denote an anode electrode, a cathode electrode and a gate electrode, respectively, while numeral 4 denotes a cathode region, 5 denotes a gate region, 6 denotes an anode region, and 7 denotes a semiconductor substrate. The lateral thyristor shown in FIG. 1 and in more general hitherto known thyristors suffer from drawbacks described below. When a positive voltage is applied to the anode with a negative voltage applied to the cathode electrode, the thyristor takes a blocking or non-conducting state so far as the gate electrode is closed. However, when a voltage $v_a$ which increases as a function of time (i.e. a voltage having a positive value of $dv_a/dt$) is applied to the anode electrode 1, a displacement current is produced and flows from the anode electrode 1 to the cathode electrode 2. This displacement current will then act as a gate trigger current to drive undesirably the thyristor into the conducting state. Such phenomenon provides a serious problem particularly in applications in which the thyristor is employed in a circuit subjected to various noises and/or operated at a high switching frequency, involving a degraded reliability of the thyristor and imposing restriction to a desired high speed operation. With a view to increasing the dv/dt capability, it is known to connect an external resistor between the gate electrode 3 and the cathode electrode 2 or provide means for internally producing a short-circuit between the cathode region 4 and the gate region 5, thereby to prevent the displacement current from flowing into the cathode region as the gate trigger current. However, these measures in turn constitute a shunt current path for the gate current flowing into the cathode region 4, bringing about a new drawback that the intrinsic trigger current is increased. The increased trigger current is of course disadvantageous particularly in a circuit in which a number of the switching devices are employed since the sum of the gate currents will then amount to a significantly large value. In order to increase the dv/dt capability and at the same time reduce the trigger current, it is conceivable to provide additionally an auxiliary circuit including a transistor between the gate and the cathode region, which however means that degradation in the integration density of the switching elements and the correspondingly increased chip area well as accompanying increased manufacturing costs have to be put up with.

SUMMARY OF THE INVENTION

An object of the invention is therefore to provide a semiconductor switching device of a novel structure which evades the drawbacks of the hitherto known switching elements and is highly capable of withstanding dv/dt-effect and can be inplemented with a high integration density.

In view of above and other objects which will become more apparent as description proceeds, there is provided a semiconductor switching device which includes a semiconductor substrate of a first conductivity type having an anode region of a second conductivity type opposite to the first conductivity type formed in the semiconductor substrate adjacent to a major surface; a gate region formed adjacent to the major surface with a distance from the anode region and having a channel region of a predetermined width and depth and a cathode region formed in the gate region adjacent to the major surface so as to be directly contacted to the semiconductor substrate through the channel region, wherein a current path leading from the anode region to the cathode region through the substrate is interrupted by a depletion layer produced within the substrate in the vicinity of the channel region upon application of a reverse bias voltage between the gate and the cathode electrode. In the absence of the reverse bias voltage, the anode region, the semiconductor substrate, the gate and the cathode region cooperate to function as a thyristor.

BRIEF DESCRIPTION OF THE DRAWINGS

FIG. 9 graphically illustrates operation characteristics of the semiconductor switching device according to the present invention.

FIGS. 10A to 10C illustrate manufacturing steps for fabricating the semiconductor switching device shown in FIG. 2.

DETAILED DESCRIPTION OF THE PREFERRED EMBODIMENTS

Figure 1:
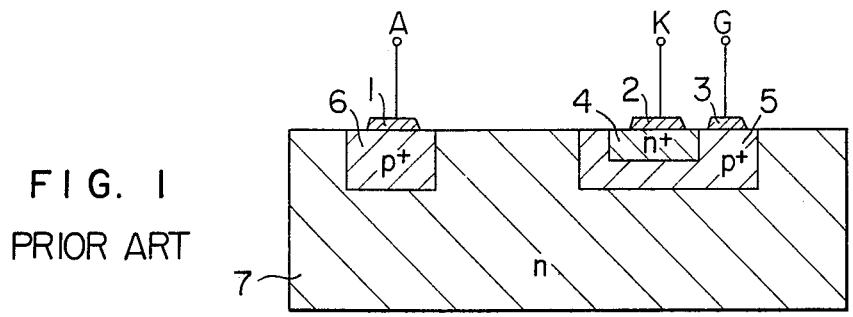
FIG. 1 is a schematic sectional view showing a structure of a conventional semiconductor switching device.
Figure 2:
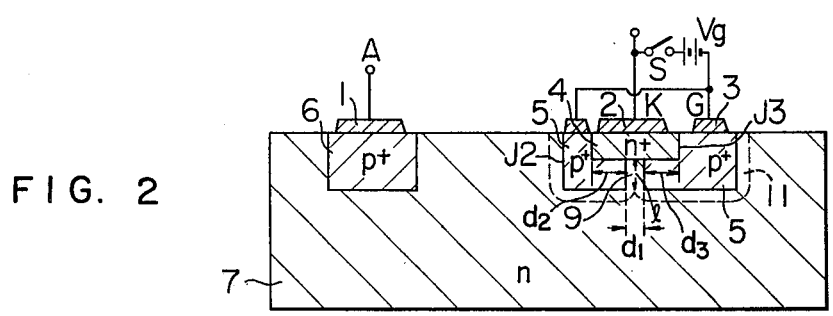
FIG. 2 is a schematic sectional view of a semiconductor switching device according to an embodiment of the invention.
Figure 3A:
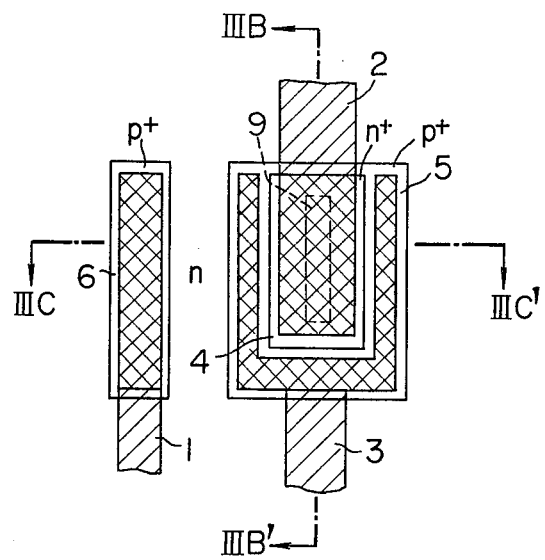
FIGS. 3A and 4A are top plan views showing electrode array patterns for the semiconductor switching device shown in FIG. 2.
Figure 3B:
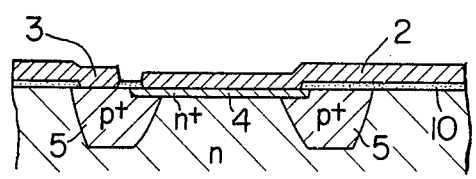
FIG. 3B is a sectional view taken along the line IIIB–IIIB' in FIG. 3A.
Figure 3C:
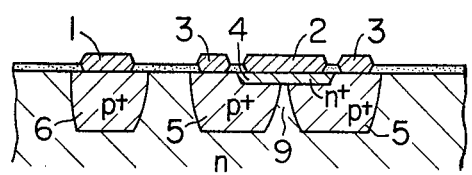
FIG. 3C is a sectional view taken along the line IIIC–IIIC' in FIG. 3A.
Figure 4A:
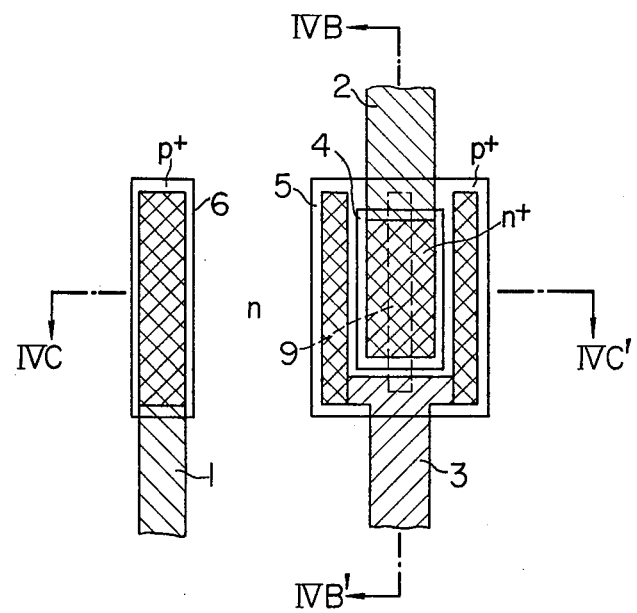
Figure 4B:
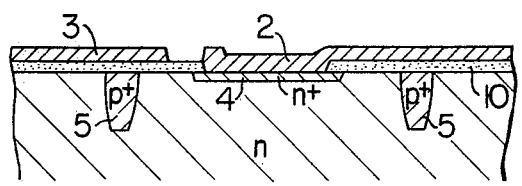
FIG. 4B is a sectional view taken along the line IVB–IVB' in FIG. 4A.
Figure 4C:
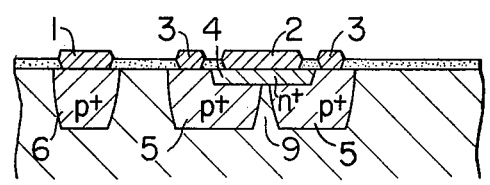
FIG. 4C is a sectional view taken along the line IVC–IVC' in FIG. 4A.

FIG. 2 shows schematically a sectional structure of a semiconductor switching device according to an embodiment of the invention. In FIG. 2, the same reference numerals are applied to like parts as in FIG. 1. Referring to FIG. 2 an anode region 6 of p+-conductivity type and a cathode region 4 of n+-type conductivity are provided at a same major surface of a semiconductor substrate of n-conductivity type. A gate region 5 of p+-conductivity type is so provided as to be partially exposed around the cathode region 4 at the major surface and forms a groove or channel region 9 of n-conductivity type immediately below the n+-cathode region 4. Consequently, the n+-cathode region 4 is directly connected to the n-substrate 7 through the n-channel region 9. It should be mentioned here that, in the case of the illustrated structure, the anode region, the cathode region, the gate region and the channel region are each formed in a strip-like configuration. Further, a plurality of the switching devices of this structure may be provided in a single semiconductor wafer, each being formed in an island or well isolated from the others by a pn-junction layer or alternatively by an insulating or dielectric layer and interconnected in desired manner. Arrays of electrodes for the anode region, the cathode region and the gate region may practically be implemented in simplified patterns shown in FIGS. 3A, 3B and 3C and FIGS. 4A, 4B and 4C. In these figures, the same reference numerals are applied to the like parts as in FIG. 2. In FIGS. 3B; 3C and 4B; 4C, reference numeral 10 denotes a film of $SiO_2$ which does not appear in FIGS. 3A and 4A. Although the n-channel region 9 is shown as lying within the boundary of the cathode region 4 in FIGS. 3A and 3C, it should be understood that the n-channel region may extend longitudinally beyond the cathode region 9 into the substrate region as shown in FIGS. 4A and 4C. However, in any case, the channel region 9 should preferably be positioned in a longitudinal alignment with and immediately below a middle portion of the cathode region 4 as seen from FIGS. 3A, 3C and 4A, 4C in order to assure a symmetrical current extraction and prevent non-uniformity in a current density when the switching device is turned off. It is further to be noted that the width $d_1$ of the channel 9 is so selected as to be narrower than the widths $d_2$, $d_3$ of the lower surface of the cathode region 4 opposed to the major surface at both longitudinal sides of the channel region 9 as measured from the respective longitudinal edges of the channel region 9 in the width direction thereof. This arrangement is particularly important for enhancing the action and effect envisaged by the invention, as will be made more apparent as description proceeds.

Figure 5A:
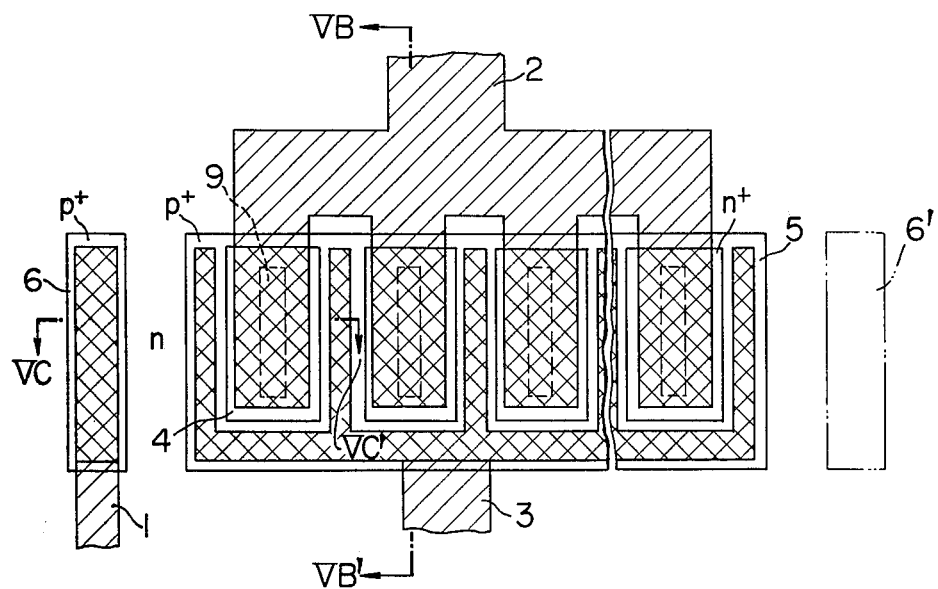
FIG. 5A is a top plan view of a semiconductor switching device according to another embodiment to the present invention.
Figure 5B:
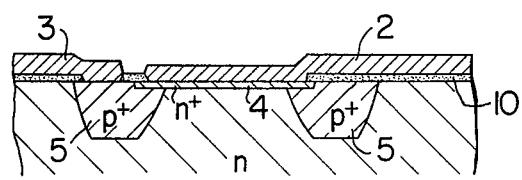
FIGS. 5B and 5C are sectional views taken along lines VB–VB' and VC–V' in FIG. 5A, respectively.
Figure 5C:
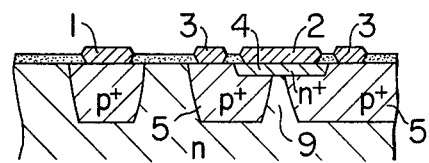

FIGS. 5A, 5B, 5C shows another embodiment of a semiconductor switching device of this invention in which a plurality of channels (for example, 4 channels as seen from the figure) are provided. In FIGS. 5A, 5B, 5C, the same reference numerals are applied to like parts as in FIG. 2. Referring to FIG. 5A, a gate region 5 is integrally formed to surround a plurality of strip-like cathode regions 4 spaced apart from each other and arranged in parallel. The plurality of channel regions 9 are provided beneath the respective cathode regions. An anode electrode 1, a comb-like cathode electrode 2, and a comb-like gate electrode 3 are kept in ohmic contact with the anode region 6, the cathode regions 4 and the gate region 5. The comb-like cathode electrode 2 and the comb-like gate electrode 3 are arranged in interdigitated form. The divergent arrangement of the gate electrode in such interdigitated form provides a small voltage drop in the gate region 5, which makes easy a gate turn-off action. A plurality of anode regions may be arranged. Namely, as shown in a phantom line in FIG. 5A another anode region 6' may be added, which advantageously expands a current path and decreases a forward voltage drop.

Figure 6A:
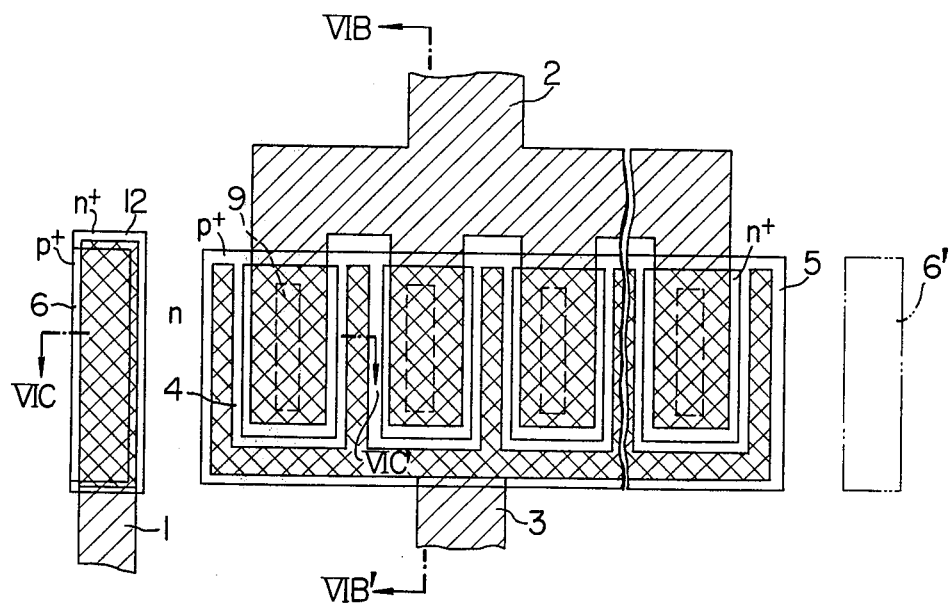
FIG. 6A in a top plan view of a semiconductor switching device according to further embodiment according to the present invention.
Figure 6B:
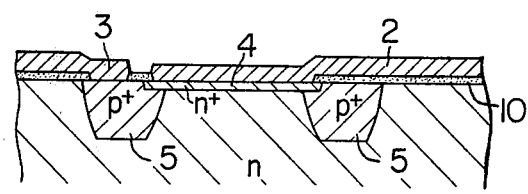
FIGS. 6B and 6C are sectional views taken along lines VIB–VIB' and VIC–VIC' in FIG. 6A, respectively.
Figure 6C:
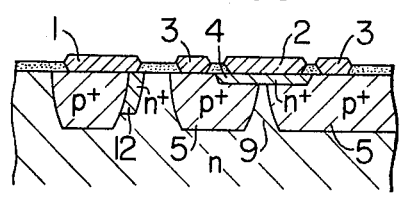

FIGS. 6A, 6B, 6C show further embodiment of a semiconductor switching device of this invention which is a modification of FIGS. 5A, 5B, 5C and in which a high impurity region 12 of n+ conductivity type is provided to be adjacent to the anode region 6 at at least one portion thereof in an area in the main surface opposite to the gate region 5, and the anode electrode 1 is kept in ohmic contact to both the anode region 6 and the high impurity region 12.

In FIGS. 6A, 6B, 6C, the same reference numerals are applied to like parts as in FIGS. 5A, 5B, 5C. This structure provides the following effects.

1. The high impurity region 12 stops a depletion layer which may extend from the gate region 5, which enhances the breakdown voltage of the device.

2. The charges stored in the base region (the substrate 7) at the time of turn-off of the device are derived through the high impurity region 12 to the anode electrode 1 and annihilated there, which provides a short turn off time. It is of course that the above arrangement of the high impurity region 12 and the anode electrode 6 are also applied to the embodiments of FIGS. 3A, 3B, 3C and 4A, 4B, 4C.

Figure 7:
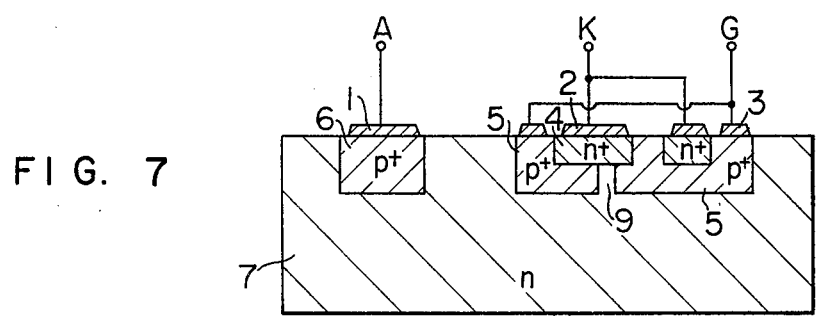
FIGS. 7 to 8 show yet further embodiments of the present invention.
Figure 8:
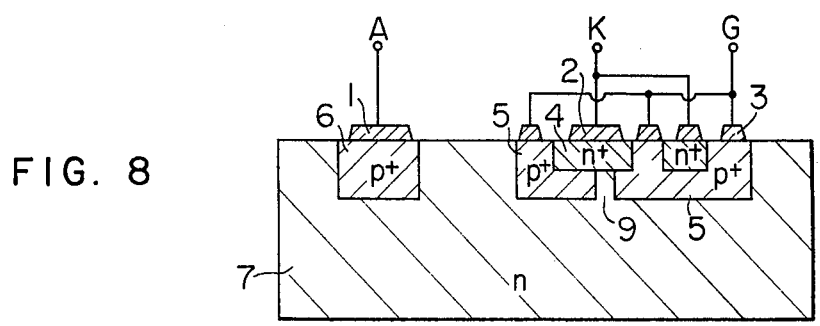

Now, description will be made on the principle of operation of the semiconductor switching device according to the invention. It is assumed that the gate electrode 3 is connected to a negative pole of a power supply source of voltage $V_g$ with the cathode electrode 2 connected to a positive pole of the power supply source so that a junction J3 is biased reversely or backwardly when a switch S is closed. Under this condition, there will be produced a depletion layer 11 as indicated by a dashed line. However, the spatial extension of the depletion layer 11 is in general restricted in the regions other than the n-channel region 9, which can be explained by the fact that the impurity concentrations of the p+-gate region 5 and the n+-cathode region 4 are selected relatively higher than that of the n-channel region 9 which is equal to the impurity concentration of the n-semiconductor substrate 7. When the width $d_1$ and depth l of the n-channel region 9 as well as the voltage $V_g$ of the power supply source are selected at appropriate values, the n-channel region 9 can be perfectly pinched off by the depletion layer 11. In such condition, no current will flow from the anode electrode 1 to the cathode electrode 2 even if a voltage which is positive relative to the cathode electrode 2 is applied to the anode electrode 1, because the n-channel region 9 constituting a part of the current path between the anode electrode 1 and the cathode electrode 2 is completely pinched off. In other words, the switching device is in a blocking or non-conducting state. Of course, a rapid rise of the anode voltage applied to the anode electrode 1 may produce a displacement current, which will not however flow across the junction J3 but flow to the gate electrode 3 and hence to the cathode electrode 2 by way of an external circuit. This feature in combination with the negative biasing of the gate electrode 3 relative to the cathode electrode 2 will never give rise to the accidental turn-on of the switching device. Even if the p-gate region 5 lying immediately below the n+-cathode region 4 is relatively broader to bring about a voltage drop in the lateral or transverse direction due to the displacement current, the switching device can be positively prevented from being undesirably turned on by applying the gate voltage $V_g$ applied to the gate electrode 3 of a sufficiently great magnitude to overcome the lateral voltage drop described above. Further, by providing an auxiliary n+-cathode region in the p-gate region 5 as illustrated in FIG. 7 or alternatively increasing the number of the electrodes connected to the p+gate region 5 as illustrated in FIG. 8, the voltage drop in the lateral or transverse direction due to the displacement current can be much more reduced, thereby to inhibit more positively the erroneous turn-on of the switching device. In FIGS. 7 and 8, the same reference numerals are applied to like parts as in FIG. 2.

When the reverse bias voltage across the junction J3 between the p-gate region 5 and the n+-cathode region 4 is removed by opening the switch S, the depletion layer 11 extending into the n-channel region 9 will then disappear, resulting in the current being allowed to flow from the anode electrode 1 to the cathode electrode 2 through the n-channel region 9 upon application of a positive voltage onto the anode electrode 1 relative to the cathode electrode 2. When positive holes are injected into the n-substrate from the p+-anode region 6 due to the current flowing through the n-channel region 9 and reach the junction J2 formed around the p-gate region 4, electrons are then injected into the p-gate region 5 from the n+-cathode region 4. Consequently, when a sum of the current amplification factors $\alpha_{pnp}$ and $\alpha_{npn}$, respectively of a p+np+-transistor constituted by the p+-anode region 6, the n-substrate 7 and the p+-gate region 5 and an np+n+-transistor constituted by the n-substrate 7, the p+-gate region 5 and the n+-cathode region 4 becomes greater than 1 (a unit), a p+np+n+-thyristor constituted by the p+-anode region 6, the n-substrate 7, the p+-gate region 5 and the n+-cathode region 4 is turned on. The n-channel region 9 will then function as a diode, while the other portions cooperates with one another to function as a thyristor, whereby current flows into all the region of the n+-cathode region 4. Such thyristor operation will result in an increased conducting area of the device and significantly reduce the turn-on voltage to a great advantage.

FIG. 9 graphically illustrates characteristics of the switching device according to an embodiment of the invention in which the dimensions $d_1$ and $l$ described hereinbefore have been selected equal to 3 μm and 5 μm, respectively. When the gate electrode 3 is opened with a positive voltage being applied to the anode electrode 1, the switching device is turned on (i.e. in the conducting state) to allow the anode current to flow therethrough. When the source voltage $V_g$ is −3.5 volts, no current flow will be produced because of the n-channel region 9 being pinched off. However, as the anode voltage is increased, the potential barrier produced in the n-channel region 9 is cleared by the electric field of the depletion layer 11 extending from the junction J2 around the p+-gate region 5 toward the p+-anode region 6, thereby to eventually allow the current to start flowing. The anode voltage which can be blocked by increasing the gate voltage will increase in a manner illustrated in FIG. 9. However, there is an upper limit imposed on the forward blocking voltage since the voltage applied across the gate-cathode path is subjected to a limit. By selecting the width $d_1$ of the n-channel region, the pinch-off voltage can be correspondingly decreased, which means that a high anode voltage can be blocked with the aid of a relatively low gate voltage. Further, it has to be pointed out that the gate voltage can be made lower, as the depth $l$ of the n-channel region 9 is selected greater. In practice, optimum values for the width and the depth of the n-channel 9 are selected in consideration of the reproducibility of the fabricating process as well as the thickness of the p+-gate region 5 of the thyristor switch.

As will be appreciated from the above description, a characteristic feature of the switching device according to the invention can be seen in a composite structure including a lateral thyristor and a field controlled switching device, which is very advantageous in that a high dv/dt-capability can be attained and that integrated structure can be easily realized. These and other advantages of the invention may be more clearly understood by comparing it with a hitherto known thyristor structure such as disclosed in U.S. Pat. No. 4,060,821 and applied to a lateral thyristor, for example. In the case of the prior art structure disclosed in the above U.S. patent, there is interposed an n-layer to extend to one main surface between a cathode region and a gate region. Presence of such n-layer corresponding to the channel region 9 of the device according to the present invention will however act to increase the turn-on voltage in the case of the lateral thyristor structure according to the invention. Accordingly, the invention teaches the structure which can eliminate the need for provision of such n-type layer to assure more effective thyristor operation and allow a larger current to be processed. Further, according to the teaching of the invention, the n-channel width can be made narrower, while the area of the cathode region can be made larger than the exposed area of the gate region. Consequently, a large current can be turned on and off with a relatively low gate voltage and a relatively small area of the gate region at a relatively high integration density of the integrated structure. In the second place, the epitaxial growth process indispensable for the fabrication of the thyristor structure disclosed in the above cited U.S. patent is not required in the case of the swiching device according to the invention. In general, when a plurality of switching elements are to be implemented in an integrated structure, it is necessary to isolate the switching devices or elements from one another. In this connection, it is noted that an attempt to minimize the electrostatic capacity between the switching elements by employing an isolation of an isolated gate type will requires a specific selective epitaxial growth process, incurring expensiveness in manufacture, since such requirement can not be fulfilled by a conventional technique of uniform epitaxial growth over a whole wafer. Besides, the epitaxial growth process by itself is expensive, as pointed out in the specification of U.S. Pat. No. 4,037,245.

In the third place, difficulty may be encountered in attaining an impurity concentration of an epitaxially grown layer equal to or lower than that of the substrate. For example, when an epitaxially grown layer having an impurity concentration of $1 \times 10^{13}$ cm$^{-3}$ is to be formed in a semiconductor substrate having an impurity concentration of $1 \times 10^{15}$ cm$^{-3}$, there may undesirably be formed a high resistivity layer or a p-inversion layer in the interface between the substrate and the epitaxial layer due to a so-called auto-doping from a burried gate layer. Such high resistivity layer allows therein an abnormal instrusion of the depletion layer extending between the anode region and the gate region, involving the problem of punch-through and reducing a breakdown voltage. On the other hand, formation of the inversion layer provides an obstacle in forming the channel in a satisfactory or normal manner and at the same time gives rise to a short-circuited state between the anode electrode and the gate electrode. Even if the fatal characteristic abnormalities due to the auto-doping could be prevented from ocurring. Stacking faults and misfit dislocations will often take place at the interface between the substrate and the epitaxially grown layer, involving possibly degradation in the breakdown voltage and increase in the leak current. In contrast, the lateral type semiconductor switching device can be fabricated simply by a selective diffusion technique through treatments such as diffusion, evaporating electrode deposition and so forth advantageously for easy integration. Additionally, no dv/dt compensating circuit is required, a correspondingly increased integration density can be attained.

Next, a typical example of the process for fabricating the switching device of a structure shown in FIG. 2 will be briefly described by referring to FIG. 10A, FIG. 10B and FIG. 10C. At first, an n-semiconductor substrate 7 (FIG. 10A) is prepared which has preferably impurity concentration of $5 \times 10^{14}$ atoms/cm$^3$ and thickness not smaller than 50 $\mu$m. Then the p$^+$-anode region 6 and the p$^+$-gate region 5 are formed through selective diffusion of p$^+$-type impurity such as boron, for example, from one major surface simultaneously with the formation of the n-channel region 9 (FIG. 10B). The anode region 6 may be of a p$^+$-type diffused layer of 150 $\mu$m in width, 300 $\mu$m in length and 15 $\mu$m in depth or thickness. The p$^+$-gate region 5 may be of a p$^+$-diffused layer of 150 $\mu$m wide, 300 $\mu$m thick. The impurity concentration in the regions adjacent to the major surface is selected on the order of $5 \times 10^{13}$ atoms/cm$^3$ so that switching operation can be effected at the pnpn-junctions obtained when the n$^+$-cathode region 4 has been formed through diffusion. In practice, the processes described so far may be accomplished by placing a boronnitride wafer and a silicon wafer in a quartz tube and holding at a temperature of about 950° C. for about 30 minutes in the atmosphere of an inert gas and subsequently heating the silicon wafer at about 1200° C. for about four hours in an oxidiging atmosphere. The p$^+$-anode region 6 and the p$^+$-gate region 5 are formed in the major surface in opposition to each other with a distance of about 100 $\mu$m therebetween. The n-channel region 9 formed in the p$^+$-gate region 5 should preferably have a width of 3 $\mu$m and length of 260 $\mu$m. Subsequently, the n$^+$-cathode region 4 is formed through selective diffusion of an n$^+$-impurity such as phosphorus, for example. When the surface dimension is selected to be of 80 $\mu$m $\times$ 280 $\mu$m with a thickness of 10 $\mu$m, the n$^+$-cathode region 4 is implemented in a structure surrounded by the p$^+$-gate region 5 except for the portion corresponding to the n-channel region 9 (FIG. 10C). For the diffusion of phosphorus, vapor of POCl$_3$ may be introduced onto the silicon substrated in a heated state. For example, by such thermal treatment at 950° C. for 30 minute, the phosphorus diffused layer can be formed which has a high impurity concentration in the cathode region adajent to the major surface. Thereafter, the semiconductor substrate thus obtained is subjected to a thermal treatment at 1200° C. for 60 minutes in an oxidizing atmosphere thereby to form ultimately the n$^+$-cathode region 4 of 10 $\mu$m in depth having the surface impurity concentration of $2 \times 10^{20}$ atoms/cm$^3$. Finally, the electrodes 1, 2 and 3 are contacted to the p$^+$-anode region 6, the n$^+$-cathode region 4 and the p$^+$-gate region 5, respectively, to accomplish the switching device of the structure according to the invention as shown in FIG. 2. The metallic electrodes may be formed of aluminium films of 2 $\mu$m thick through evaporation, for example. The width of the anode electrode 1 and the cathode electrode 2 should preferably on the order of 60 $\mu$m, while the gate electrode 3 should preferably be formed of an aluminium film having width of $+\mu$m in the case of the illustrated embodiment. In this manner, a thyristor unit of p$^+$np$^+$n$^+$-structure and a diode unit of p$^+$nn$^+$-structure have been implemented in parallel to each other in the current path extending from the anode region 6 to the cathode region 4. In the above description, it has been of course assumed that the use of a protection or mask film for the selective diffusion as well as a protection film for forming the pn-junctions is indispensable for the fabrication of the intended switching device. However, since the protection technics are well known in the art, further detailed description thereof will be unnecessary. FIG. 9 graphically shows the typical characteristics of a switching device actually fabricated according to the manufacturing process described above.

The invention has now proposed a novel semiconductor switching device in which the thyristor and the diode are caused to operate in parallel to each other in the conducting state, while non-conducting or blocking state is brought about by pinch off of the channel region under the electric field control to interrupt the current flow. In the following, description will be made on advantageous feature of the switching device according to the invention by comparing with conventional switching devices in order to have a better understanding of the invention. At first, comparison will be made with a conventional semiconductor switch which incorporates a transistor as a switching device. The switching transistor is turned on upon application of a base current and turned off when the base current becomes zero. Accordingly, a current supply circuit is inevitably required in order to maintain the transistor switch in the conducting state. In contrast, in the case of the switching device according to the invention, the transition from the non-conducting state to the conducting state or vice versa can be effected merely by applying or removing the gate voltage without requiring any appreciable driving power. Certainly, a current will flow in the gate circuit even in the switching device according to the invention when the switching operation is made to go from the conducting to the non-conducting state. However, the duration of such current flow is extremely short and involves no appreciable power consumption. In this manner, the switching device according to the invention exhibits a very high ratio of the power required for the control to the power to be controlled, which is a very advantageous and desirable characteristic for a switching device. Further, the switching device according to the invention exhibits a high withstanding capability against a surge current and an excellent reliability as the switching device without suffering from the secondary break-down phenomenon.

The advantages of the switching device according to the invention over the conventional thyristor structure such as shown in FIG. 1 will be obvious from the description made hereinbefore. In the case of the conventional field controlled switching device, the main current path is constituted only by the channel as a result of which a narrow width of the channel region will often give rise to an increaed turn-on voltage. In order to overcome this disadvantage, the channel region has been realized in a plurality of separate sub-channels, which however means that precise and elaborate treatments are required for the fabrication of the field controlled thyristor in a much complicated process. To the contrary, in the case of the semiconductor switching device according to the invention, the main current flows through the thyristor structure with the $p^+nn^+$-type diode structure being subjected to only a small fraction of the main current for turning on the thyristor. Thus, the cathode region can be implemented in a relatively large dimension by virtue of such structure in which the cathode region is commonly shared by the thyristor and the diode, as shown in FIG. 8. Additionally, the manufacturing process can be much simplified. In reality, a locally fine diffusion mask pattern is required only when the channel region is formed. The other fabricating steps can be carried out in the substantially same way as the conventional thyristors.

It has been found that the thyristor portion should preferably have a larger area than that of the diode portion formed by the channel region at least below the lower surface of the cathode region opposite to the major surface to flow the main current through the thyristor portion in order to make the various advantages described above to be available at maximum.

Besides, since the surface impurity concentration in the exposed surface portion of the p-gate region is higher than that of the n-base region (n-subtrate 7) as is illustrated in FIG. 5, means for conducting the displacement current to the localized gate electrode 3 can be favorably realized in a simplificated manner without requiring any complicated electrode pattern. Obviously, a plurality of the n-channel regions 9 may be provided in order to evade current concentration upon turn-on operation of the switching device.

We claim:

1. A lateral field controlled thyristor; a semiconductor substrate of a first conductivity type including a first region having a second conductivity type opposite to said first conductivity type and formed in a major surface of said semiconductor substrate, a second region of said first conductivity type having a higher impurity concentration than that of said semiconductor substrate, said second region being formed in said major surface of said semiconductor substrate spaced from said first region for a predetermined distance, and a third region of said second conductivity type formed adjacent to said second region so as to completely surround said second region except a channel region formed immediately below said second region, said third region having a portion exposed at said major surface of said semiconductor substrate and said channel region having an area smaller than that of the pn junction formed between said second and third semiconductor region, wherein a current path extending from said first region to said second region includes a thyristor structure by way of said third region and a diode structure by way of said channel region, and said current flowing mainly in parallel with said major surface.

2. A semiconductor switching device as claimed in claim 1, wherein each of said first, second and third regions and said channel region is formed in a strip-like configuration.

3. A semiconductor switching device as claimed in claim 2, wherein said first, second and third regions and said channel region extend in parallel with one another.

4. A semiconductor switching element as claimed in claim 3, wherein said channel region is formed immediately below said second region to be arranged at a middle portion thereof in a width direction of the channel region.

5. A semiconductor switching device as claimed in claim 3, wherein the width of the channel region is so selected as to be narrower than respective widths of the lower surface of the second region opposite to the major surface at both longitudinal sides of the channel region as measured from the respective longitudinal edges of the channel region in the width direction thereof.

6. A semiconductor switching device as claimed in claim 3, wherein said channel region is so arranged as to be within the lower surface of the second region opposite to the major surface of the semiconductor surface.

7. A lateral field controlled thyristor, which comprising: a first semiconductor region of a first conductivity type having at least one exposed major surface, a second semiconductor region of said first conductivity type formed in said first semiconductor region adjacent to said exposed major surface and having a higher impurity concentration than that of said first semiconductor region, a third semiconductor region of a second conductivity type opposite to that of said first conductivity type and formed in said first semiconductor region adjacent to said exposed major surface and spaced from said second semiconductor region by said first semiconductor region being interposed between said second and third semiconductor regions, a pair of main electrodes each formed on the exposed major surface of said second and third semiconductor regions, a fourth semiconductor region of said second conductivity type formed in said first semiconductor region adjacent to said exposed major surface in contact with said second semiconductor region except a portion of a surface of said second semiconductor opposite to said exposed major surface, said fourth semiconductor region spaced from said third semiconductor region by said first semiconductor region by said first semiconductor region, and a control electrode formed on the exposed surface of said fourth semicondutor region, wherein the thickness and the impurity concentration of said fourth semiconductor region are selected in such a manner that a pnpn thyristor structure including said second, fourth, first and third semiconductor regions becomes a current path between said pair of main electrodes as well as a diode structure by way of a channel region formed by said portion of a surface of said second semiconductor opposite to said exposed major surface and said first semiconductor region upon application of a voltage of such polarity that a pn-junction formed between said first and third semiconductor regions is biased forwardly, and said channel region has an area smaller than that of the pn-junction formed between said second and fourth semiconductor regions, and said current is turned off by applying a reverse bias voltage between an electrode connected to said first semiconductor region and said control electrode, said reverse biased voltage being of such nature that a pn-junction formed between said first and fourth semiconductor regions is biased backwardly and that a resulting depletion layer surrounds said second semiconductor region.

8. A semiconductor switching device as claimed in claim 7, wherein said main electrode connected to said second semiconductor region and said control electrode are arrayed in an interdigitated pattern.

9. A lateral field controlled thyristor comprising a first semiconductor region of a first conductivity type having at least a major surface, a second semiconductor region of a second conductivity type opposite to said first conductivity type and formed in said first semiconductor region adjacent to said major surface, a third semiconductor region of said first conductivity type formed in said first semiconductor region adjacent to said major surface and spaced from said second semiconductor region, said third semiconductor region having a higher impurity concentration than that of said second semiconductor region, and a fourth semiconductor region of said second conductivity type formed adjacent to and substantially surrounding said third semiconductor region, wherein said second, first, fourth and third semiconductor regions constitute a thyristor, and a channel region formed by said first and said third semiconductor regions has an area smaller than that of the pn-junction formed between said second and fourth semiconductor regions and wherein said first and third semiconductor regions constitutes a diode.

10. A lateral field controlled thyristor comprising:
(a) a semiconductor substrate of a first conductivity type having a pair of major surfaces, said semiconductor substrate including an anode region of a second conductivity type opposite to said first conductivity type and formed adjacent to one of said major surfaces, a cathode region of said first conductivity type formed adjacent to said one major surface with a distance from said anode region, said cathode region having a higher impurity concentration than that of said semiconductor substrate, and a gate region exposed at said one major surface and formed so as to directly surround said cathode region and having a groove of predetermined width and depth for directly contacting said cathode region to said semiconductor substrate immediately below said cathode region wherein said groove has an area smaller than that of the pn junction formed between said cathode and said gate region; and
(b) an anode, a cathode and a gate eleftrode each being ohmic contacted to said anode, cathode and gate regions at said one major surface.

11. A lateral field controlled thyristor comprising:
(a) a strip-like anode region of a first conductivity type formed in a semiconductor substrate adjacent to a major surface thereof, said semiconductor substrate being of a second conductivity type opposite to said first conductivity type;
(b) a strip-like gate region of said first conductivity type formed in said semiconductor substrate adjacent to said major surface with a distance from said anode region;
(c) a strip-like cathode region of said second conductivity type formed in said gate region adjacent to said major surface and having a higher impurity concentration than said semiconductor substrate; and
(d) at least one strip-like channel region formed immediately below said cathode region to extend through said gate region for directly contacting said cathode region to said semiconductor substrate, and said channel region has an area smaller than that of the pn-junction formed between said cathode region and said gate region.

12. A lateral field controlled thyristor comprising:
(a) a semiconductor substrate of a first conductivity type having a first region of a second conductivity type opposite to said first conductivity type formed in a major surface of said semiconductor substrate, a second region of said first conductivity type formed in said major surface spaced form said first region, said second region having a higher impurity concentration than said semiconductor substrate, a third region of said second conductivity type partially exposed at said major surface and formed adjacent to said second region so as to completely surround said second region except for a channel region formed immediately below said second region, wherein said channel region has an area smaller than that of the pn-junction formed between said first region and said second region, and a fourth region of said first conductivity type formed in said major surface adjacent to said first region at at least one portion of a side opposite to said third region and having a higher impurity concentration than said semiconductor substrate; and
(b) a first electrode kept in ohmic contact to both said first and fourth regions, a second electrode kept in ohmic contact to said second region and a third electrode kept in ohmic contact to said third region at said major surface, wherein a current path leading from said first region to said second region includes a thyristor structure by way of said third region and a diode structure by way of said channel region.

13. A semiconductor switching device as claimed in claim 7, wherein each of said second, third and fourth regions and said channel region is formed in a strip-like configuration.

14. A semiconductor switching device as claimed in claim 13, wherein said second, third and fourth regions and said channel region extend in parallel with one another.

15. A lateral field controlled thyristor as claimed in claim 14, wherein said channel region is formed immediately below said second region to be arranged at a middle portion thereof in a width direction of the channel region.

16. A lateral field controlled thyristor as claimed in claim 14, wherein the width of the channel regionis so selected as to be narrower than respective widths of the lower surface of the second region opposite to the major surface at both longitudinal sides of the channel region as measured from the respective longitudinal edges of the channel region in the width direction thereof.

17. A lateral field controlled thyristor as claimed in claim 14, wherein said channel region is so arranged as to be within the lower surface of the second region opposite to the major surface of the semiconductor surface.

18. A lateral field controlled thyristor as claimed in claim 7, wherein the impurity concentration of said first semiconductor region is higher at a portion adjacent to said third semiconductor region than the other portion of said first semiconductor region and one of the main electrodes is formed in contact with both said third semiconductor region and said portion having a higher impurity concentration.

* * * * *